United States Patent [19]

Hallberg et al.

[11] Patent Number: 4,829,533
[45] Date of Patent: May 9, 1989

[54] FREQUENCY AND OUTPUT REGULATION IN LASER DIODES

[76] Inventors: Bengt O. Hallberg, Kärrgränd 108, S-16246 Vällingby; Sten H. Rislund, Riksbyggevägen 8A, S-69144 Karlskoga, both of Sweden

[21] Appl. No.: 185,361
[22] Filed: Apr. 19, 1988

Related U.S. Application Data

[63] Continuation of Ser. No. 821,734, Nov. 26, 1985.

[30] Foreign Application Priority Data

Mar. 30, 1984 [SE] Sweden ............... 8401773

[51] Int. Cl.$^4$ .................. H01S 3/13; H01J 5/02; G01J 3/28
[52] U.S. Cl. ................. 372/29; 372/31; 372/32; 250/239; 250/552; 250/578; 356/326
[58] Field of Search .......... 250/239, 552, 578; 356/326; 372/29, 31, 32

[56] References Cited

U.S. PATENT DOCUMENTS

| | | | |
|---|---|---|---|
| 2,847,899 | 8/1958 | Walsh | 356/326 |
| 3,898,583 | 8/1975 | Shuey | 372/29 |
| 3,967,211 | 6/1976 | Itzkan et al. | 372/32 |
| 4,103,254 | 7/1978 | Chikami | 372/32 |
| 4,181,901 | 1/1980 | Heyke | 372/31 |
| 4,309,671 | 1/1982 | Malyon | 372/32 |
| 4,338,577 | 7/1982 | Sato et al. | 372/29 |
| 4,513,422 | 4/1985 | Buholz | 372/32 |

FOREIGN PATENT DOCUMENTS

948808 2/1964 United Kingdom .
1491260 11/1977 United Kingdom .

OTHER PUBLICATIONS

Smith, Circuits Devices and Systems, 2nd Ed., 1971, 465-466.

Primary Examiner—Eugene R. LaRoche
Assistant Examiner—Michael B. Shingleton
Attorney, Agent, or Firm—Pollock, Vande Sande & Priddy

[57] ABSTRACT

The present invention is a regulator circuit for combined regulation of the emitted wavelength from a laser diode, and its output. According to the invention, a fraction of the radiation from the laser diode (1) is caused to be transmitted, via a glass fibre (2) to a sensor unit (8). The sensor unit contains a dispersing device (3), possibly separate focussing devices, and a detector unit (4). The detector unit (4) contains one or more detector elements, whose electrical output signals are conducted to a signal decoding unit (5). The signal decoding unit (5) is connected (i) to a temperature generator (6), in turn connected by thermal means to the laser diode, (ii) to a power generator (7) which is electrically connected to the laser diode. By using a concave lattice as the dispersing device, the reflective radiation from the lattice (3) is focussed on to the detector elements in the detector unit. By placing two detector units close together, side by side, and having the radiation focussed on the detector units adjusted such that the radiation beam, at the correct wavelength, hits the detector elements in equal measure, balanced electrical signals from the detector elements are obtained, any differential controlling the temperature generator (6), and the sum of which controls the power generator (7).

8 Claims, 2 Drawing Sheets

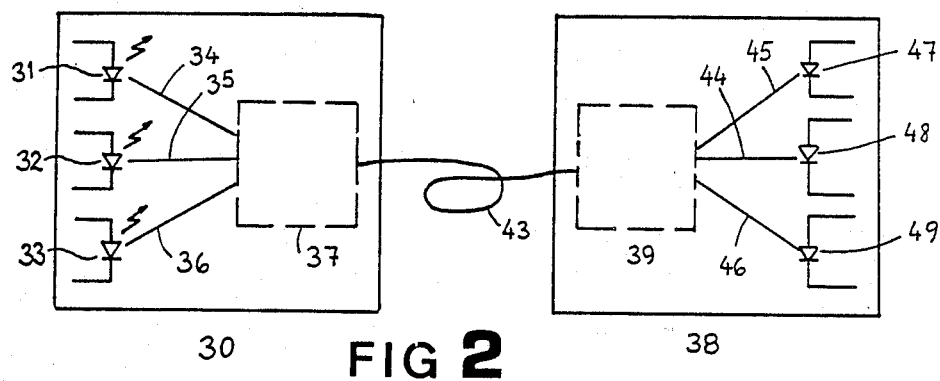
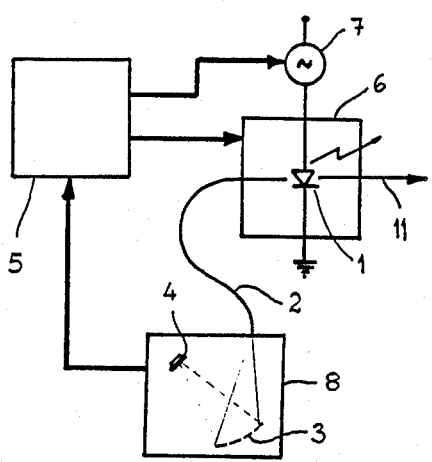
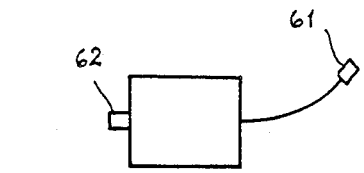
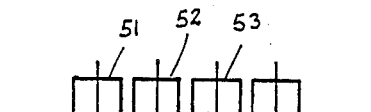
FIG 1
FIG 2
FIG 5
FIG 4
FIG 3

FREQUENCY AND OUTPUT REGULATION IN LASER DIODES

This application is a continuation of application Ser. No. 821,734, filed Nov. 26, 1985.

The present invention is a process and device for the combined regulation of frequency and output power in laser diodes.

The increasingly rapid pace of development in optical fibres for communication purposes has resulted in the growing adoption of multiplex transmission of information by virtue of the constantly increasing frequency ranges of optical fibres. For this purpose, a laser diode is generally used as a transmitter. When transmission is made at several different frequencies and via multiplexing, the former travel outwards in the form of optical radiation at somewhat differing wavelengths close to an optical fibre; it is therefore essential for each transmitting laser diode to emit at one and the same wavelength very accurately, and not to drift in wavelength—as a result of ageing or the effects of temperature—so as to encroach on the wavelength of any of the other transmitters. A typical difference in wavelength may be in the order of 20 nm, but as this form of technology develops its aim will be to reduce this wavelength differential, possibly by as low as 3 nm. Naturally, this will place considerable demands on frequency and wavelength stability in the transmitting laser diodes.

SUMMARY OF THE INVENTION

The purpose of the present invention is therefore to present a process and device for combined regulation of frequency and output power in a laser diode. It should be possible for regulation of the frequency and output power to be performed with the maximum precision. Furthermore, the regulator circuit should also be insensitive to both thermal and ageing effects. It is also advantageous for the circuit to be simply and cheaply constructed.

The invention solves these problems It is assumed here that the process must regulate both frequency and output power in the laser diode. In the invention, a constant proportion of the monochromatic radiation emitted from the laser diode is caused to be channelled, via an optical fibre, to a dispersing device fitted in a sensor unit, which, depending on the wavelength of the monochromatic radiation, deflects the latter at a certain angle. The aforesaid deflected radiation is caused to be focussed on to one or more detectors fitted in a detector unit, also incorporated in the sensor unit, which then (i) scans the position of the radiation beam and therefore its frequency, and (ii) scans the intensity of the constant proportion of radiation and therefore the output power level of the laser diode. This information is transmitted in the form of electrical signals to a signal decoding unit, which (i) changes, via a temperature generator, the temperature of the laser diode and therefore the wavelength of the radiation emitted, and (ii) changes, via a power generator, the current supplied to the laser diode, and therefore the output power level of the laser diode, and, depending on the values scanned by the detector unit for wavelength and intensity parameters, causes the wavelength and output to be maintained constant.

It may also be worth mentioning that the temperature generator, which may also be referred to as a controller, is capable of controlling the temperature in the laser diode at both above and below the ambient temperature. Since, in this way, one and the same sensor unit scans both the emitted wavelength and the output of the emitted radiation, a very simple and reliable control circuit is achieved. In addition, by arranging for the signal decoding unit to control both the temperature of the laser diode—upon which the emitted wavelength depends—and its supply current—upon which the emitted output power depends—it is possible to regulate both wavelength and output independently of each other by using a single sensor unit incorporating a single detector unit. This method of regulation functions completely satisfactorily, regardless of the reason for the drift in wavelength or output power level.

In the invention, it is moreover expedient for the sensor unit—as a focussing and dispersing device—to contain a concave lattice arranged so as to focus its reflective radiation on to the radiation-sensitive surface of the detector element or elements in the detector unit, and for these components to be fixed, but adjustable, in a sealed casing or enclosure. The use of a concave lattice permits considerable simplicity of design, obviating the need for collimating and focussing devices such as lenses or mirrors. It also means extremely simple adjustment and calibration of the sensor unit to the wavelength it is to regulate in the laser diode.

In the invention, it is also advantageous to design the detector unit to contain two detector elements arranged close together, side by side, the light-sensitive surfaces of which are designed such as to lie adjacent to each other without any significant intervening space. This means that when the radiation focussed by the concave lattice hits the radiation-sensitive surfaces of the two detector elements, practically all the energy contained in the radiation beam will be absorbed by the two detector elements. The device is then adjusted such that an equally large proportion of the radiation at the correct wavelength in the laser diode will hit the radiation-sensitive surfaces of the two detector elements, at which point the amounts of current discharged by the detectors will be equal. In another variant of the invention, the two detector elements are replaced by a single, position-sensitive linear detector, which is arranged to transmit two currents whose mutual relationship indicates the position of the radiation beam, and whose total indicates the total intensity of the radiation beam.

It is also expedient to design the temperature generator to consist of a Peltier element, which, depending on the polarity of the supply current, is arranged to warm or cool the laser diode. This provides a very considerable regulating range for the emission wavelength. The invention is described in greater detail in the following, with references to the attached FIGS. 1-7.

FIG. 1 shows typical information transmission by optical fibre;

FIG. 2 shows a similar transmission via multiplexing;

FIG. 3 shows the mutual relationships between the different wavebands in the multiplex transmission illustrated in FIG. 2;

FIG. 4 shows a laser diode by prior art;

FIG. 5 shows a regulating device according to the present invention;

DESCRIPTION OF THE PREFERRED EMBODIMENT

Figure 6:
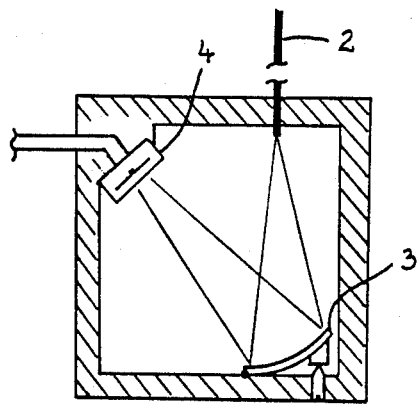
FIG. 6 shows an example of design for the sensor unit in a device according to the present invention; and finally

For information transmission by optical fibre as shown in FIG. 1, a transmitter unit 19 is used, consisting of a light-emitting diode or laser diode 1, which emits its radiation into an optical fibre 20 at the other end of which the radiation is received by a photo-detector 21 which forms part of a receiver unit 22.

FIG. 2 shows optical transmission of information by apparatus according to the prior art, via glass fibre, in which the transmitter unit 30 contains a number of laser diodes 31, 32, 33, which emit their radiation into fibres 34, 35, 36, which in turn conduct this radiation to a multiplexer unit 37, which after multiplexing dispatches all wave and frequency bands into an optical fibre 43, which transmits this radiation to a receiver unit 38 containing a multiplexer unit 39, which divides the incoming radiation into its constituent component bands and feeds the latter out via fibres 44, 45, 46, which transmit the individual radiation band to photodiodes 47, 48, 49, which are connected in turn to an electronic unit (not shown) for decoding of the incoming information.

In order to achieve maximum utilization of the band width of glass fibre 43, it is important for the various component bands (FIG. 3) 51, 52, 53 to lie as close to each other as possible. However, this implies very considerable demands on the frequency stability of the laser diodes used, since any drift in frequency/wavelength will mean that information from one channel may be carried over and overlap another of the channels, which may have serious consequences.

FIG. 4 illustrates a typical design for a laser diode. In principle, a laser diode contains two outlets, 61, 62. One discharges the major part of the emitted radiation, while the other outlet 62 discharges a small proportion of the total radiation from the laser diode. However, the relationship between these proportions always remains constant. In order to measure the output at outlet 61, through which the main part of the radiation passes, it is thus possible to use the radiation which emerges through the other outlet 62.

FIG. 5 shows an embodiment of a regulator circuit according to the present invention. In this, the laser diode 1 emits the main part of its radiation into a glass fibre 11, and a fraction of its radiation into another glass fibre 2. The latter glass fibre 2, conducts the said radiation into the sensor unit 8. Glass fibre 2 terminates inside the casing of this sensor unit, as a result of which the radiation emerges from the glass fibre and hits the dispersing device 3. By designing this dispersing device in the form of a concave lattice, which is known to possess focussing properties, the need for any lenses or spherical focussing mirrors is obviated. The radiation which falls on the dispersing device will be focussed, after being reflected from the concave lattice, on to detector unit 4. This detector unit comprises one or more detectors which emit signals, firstly indicating the position of the radiation beam along a linear path, and secondly indicating the total incident radiation output against the detectors. The latter signals from the detector unit are transmitted to a signal decoding unit 5. The signal decoding unit controls, (i) a temperature generator 6 which is connected by thermal means to the laser diode 1, which may be a Peltier element, and, (ii) a power generator 7, which supplies current to the laser diode 1. The Peltier element will warm or cool the laser diode depending on the polarity of a control current.

Figure 7:
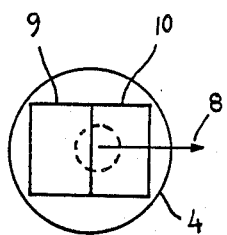
FIG. 7 shows a detector arrangement for use in the present invention.

If, for some reason, the frequency should deviate somewhat from that which is desirable, the radiation reflected from the concave lattice on to the detector unit will change direction. As a result, the radiation beam shown in FIGS. 6 and 7 will be moved over the surface of the detector (FIG. 7). As FIG. 7 shows, the radiation-sensitive sufaces of the two detector elements lie close together, side by side. If a shift in the direction of the arrow 12 occurs, imbalance in the currents from the two detector elements will result. The imbalance in the currents will cause the signal decoding unit to transmit a signal to the temperature generator 6, which is constructed to be of a size and polarity such that the temperature generator modifies its temperature, as a result of which the temperature of the laser diode 1 is also modified accordingly, the effect of which is to modify the frequency/wavelength it emits. This means in turn that the angle at which radiation is reflected from the concave lattice is moved back to the point at which the currents from the detector elements are in balance. Similarly, the signal decoding unit will ensure, via control of the power generator, that the intensity of radiation hitting the two detector elements 9, 10 is always the same.

Instead of using two detector elements, lying close together, side by side, it is often expedient to use a single, position-sensitive detector in their place. The latter is arranged to discharge two currents, whose mutual relationship indicates where a radiation beam hits its surface, and the total of which currents indicates the size of total intensity for the radiation beam over the detector surface.

This extremely simple design for a regulator circuit, allowing complete control of both wavelength and output, means an exceedingly cheap and reliable solution to the regulation problem for laser diodes.

We claim:

1. A system for regulating the radiation output power level and radiation frequency of a laser diode comprising:

first and second optical ports coupled to said laser diode, said first port coupled to an optical load;

an optical fibre having one end coupled to said second port; and a sensor unit coupled to a remaining end of said optical fibre, said sensor unit including a concave lattice for deflecting incident radiation at an angle proportional to the wavelength of said incident radiation, a position-sensitive detector for determining the position of a deflected radiation beam, whereby said radiation frequency is determined, and for measuring the total intensity level of said beam;

a power generator connected to receive a signal from said sensor unit proportional to a measured intensity level and set the emitted radiation power from said laser diode to a substantially constant level; and a temperature controller receiving a signal from said sensor unit proportional to a determined radiation frequency and maintaining said laser diode at a temperature which produces a constant radiation frequency.

2. A system according to claim 8, wherein said temperature controller is capable of controlling the temperature in the laser diode at both above and below the ambient temperature.

3. A system according to claim 8, wherein the sensor unit contains a detector which is arranged to transmit two currents whose mutual relationship indicates the position of the radiation beam, and whose total indicates the total intensity of the radiation beam.

4. A system according to claim 8, wherein the temperature controller consists of a Peltier element, which, depending on the polarity of the supply current, will warm or cool the laser diode.

5. The system of claim 1 wherein said position-sensitive detector comprises first and second radiation sensitive detectors which are position-adjustable with respect to incident radiation.

6. The system of claim 5 wherein said first and second radiation-sensitive detectors are positioned with respect to said concave lattice so that each is equally radiated when said emitted radiation is at a regulated frequency.

7. A system for regulating the power output and emission frequency of a laser diode comprising:
 (a) an output port coupling a major portion of said laser diode radiation to an optical load;
 (b) a Peltier element coupled to said laser diode which warms and cools said laser diode in response to a first control signal, whereby said emission frequency is controlled;
 (c) an optical sampling fibre having one end coupled to said laser diode, providing at a remaining end a minor portion of said laser diode radiation, said major and minor portions of radiation having intensities which are in a constant proportion;
 (d) a power generator for supplying an operating current to said laser diode which controls the total radiation intensity produced by said laser diode in response to a second control signal; and
 (e) a sensor including:
  (1) an enclosure having an opening for receiving said remaining end of said optical sampling fibre;
  (2) first and second adjacent radiation detectors positioned in said enclosure, said adjacent radiation detectors providing said second control signal to said power generator proportional to the sum of radiation incident to said detectors, and said first control signal proportional to the relative radiation levels incident on each radiation detector to said Peltier element;
  (3) a concave lattice angularly oriented within said enclosure to direct and focus radiation from said remaining end of said optical fibre to said first and second adjacent radiation detectors, said lattice providing an angle of reflection which is proportional to the wavelength of incident radiation, whereby said first and second radiation detectors provide said first control signal which is proportional to said wavelength of incident radiation.

8. The system of claim 7 wherein said concave lattice position is adjustable with respect to said radiation detector, whereby said radiation may be directed to produce at a specific wavelength equal amounts of radiation of said radiation detectors.

* * * * *